United States Patent
Sun et al.

(10) Patent No.: US 6,324,122 B1
(45) Date of Patent: Nov. 27, 2001

(54) RAM SYNCHRONIZED WITH A SIGNAL

(75) Inventors: Bruce C. Sun, SJ.; Eric W. Lee, San Jose; Huy Nguyen, Fremont, all of CA (US)

(73) Assignee: Rosun Technologies, Fremont, CA (US)

( * ) Notice: Subject to any disclaimer, the term of this patent is extended or adjusted under 35 U.S.C. 154(b) by 0 days.

(21) Appl. No.: 09/835,010

(22) Filed: Apr. 13, 2001

Related U.S. Application Data

(63) Continuation of application No. 09/613,927, filed on Jul. 11, 2000.

(51) Int. Cl.$^7$ .................................. G11C 8/00; G11C 7/00
(52) U.S. Cl. ........................ 365/233; 365/194; 365/203; 365/233.5
(58) Field of Search ................................. 365/233, 194, 365/203, 233.5

(56) References Cited

U.S. PATENT DOCUMENTS

| | | | |
|---|---|---|---|
| 5,767,715 | * 6/1998 | Marquis et al. | 365/233 |
| 6,166,993 | * 12/2000 | Yamauchi | 365/233.5 |
| 6,208,183 | * 3/2001 | Li et al. | 327/161 |

* cited by examiner

*Primary Examiner*—Son T. Dinh
(74) *Attorney, Agent, or Firm*—Carr & Ferrell LLP; Morgan E. Malino

(57) ABSTRACT

A RAM module that can increase the number of times it may be accessed within a single clock cycle. By knowing the processor's clock speed and determining a critical time, a signal optimizer may be constructed. The critical time is the longest interval of time required for a worst-case scenario memory access. A signal optimizer transforms the clock signal into a signal that has a higher frequency than the original clock signal and maintains both its high state and its low state for at least the critical time. By then allowing the RAM module to perform its access and pre-charge during the dips and posts of the optimized clock signal, the RAM module can perform multiple accesses and pre-charges during one clock cycle. The RAM module can be used for direct memory accesses such that the processor does not need to arbitrate access to the memory.

19 Claims, 7 Drawing Sheets

RAM SYNCHRONIZED WITH A SIGNAL

CROSS-REFERENCES TO RELATED APPLICATIONS

This is a continuation of Application Ser. No. 09/613,927, filed Jul. 11, 2000.

BACKGROUND OF THE INVENTION

1. Field of the Invention

This invention generally relates to electronic memories and more specifically to synchronous random access memory design.

2. Description of Related Art

Random access memory (RAM) is the most common type of memory found in computers, printers and other devices that use microprocessors. Memory is required in microprocessors because only data that is stored in memory can be manipulated. The two basic types of RAM are dynamic RAM (DRAM) and static RAM (SRAM). SRAM is faster and more reliable than the more common and less expensive DRAM.

SRAM is typically used for cache memory which is accessed frequently, and DRAM is used for main memory. Additionally, many systems allow for direct memory access (DMA) to RAM. DMA is a technique for transferring data from memory to a processor without passing it through a memory management system.

Regardless of whether and how a SRAM or DRAM is used and implemented, the overall architecture is somewhat standard. All RAM modules contain an array of memory cells and have peripheral circuits. A memory cell stores either a single bit of information (1 or 0) or a group of bits, depending upon the architecture of the RAM module. Each memory cell is defined by a unique address and accessed with peripheral circuits.

Synchronous RAM uses a clock signal to time the phases of operation of the RAM module. For active-high logic circuits, the set-up phase is performed during the high portion of the clock signal and the access phase ("AC phase") during the low portion. The phases of an active-low circuit are performed in the opposite clock states.

Certain types of asynchronous RAM also use the set-up phase and the AC phase to time its operation. When a request is sent to the RAM, signal detection circuitry is used to initiate the set-up phase. A clock generation circuit, such as a boot-strap clock buffer, is then used to separate the AC phase from the set-up phase.

During the set-up phase, the address is decoded, the decision of whether to read or write is made, and, when necessary, the memory array pre-charges. The actual reading or writing to the memory cell is performed during the AC phase. Since both phases are necessary, only one complete read or write operation can be performed during a full clock cycle for a standard RAM module.

A DMA request, however, could occur at either the first half or the second half of a clock cycle. If a DMA request were received in the second half of a clock cycle, a RAM module would not be able to process the request until the next clock cycle, delaying the time that it would take to respond to the request. Additionally, the processor would need to arbitrate the DMA request. The microprocessor could only grant a DMA request by pausing its own use of the memory while allowing the device requesting the DMA to access the memory. Although dual port memory modules would allow for dual memory access during a single clock cycle, they are far too large and costly to be used regularly.

The cost effectiveness of RAM depends not only on the module's size, but also on the speed of the clock signal. A system with a clock signal that remains in its high state for longer than is needed to complete the set-up phase is inefficient. Similarly, it is inefficient for an RAM module to remain in its AC phase for longer than is required while the clock signal is low. Since the speed of a system clock is usually selected based on the requirements of the processor rather than to optimize operation of a RAM module, many RAM modules are unnecessarily idle.

What is needed is a synchronous RAM module that overcomes shortfalls of the RAMs currently known in the art.

BRIEF SUMMARY OF THE INVENTION

The present invention provides an improved RAM module synchronized with an external signal and a method for constructing the same. The RAM module includes a memory array, control circuitry, an address decoder, pre-charge circuitry, read circuitry and write circuitry. The memory array consists of a plurality of memory cells and their associated bit lines and word lines. The control circuitry is operably connected with and regulates the operation of the memory cells. The "control time" is equal to the interval required for the control circuitry to complete its most time-consuming operation. The address decoder can select any memory cell in the memory array within an "address time." The pre-charge circuitry charges the bit lines of the memory array to a high state within a "set-up time." The "critical set-up time" is equal to the longest of the control time, the address time or the pre-charge time. The read circuitry receives signals from the bit lines of the memory cells. The write circuitry replaces the signals stored by the memory cells. The most time consuming operation can be completed in a "read time" for the read circuitry and a "write time" for the write circuitry. The "critical AC time" is the time interval equal to the greater of the read time or the write time. A signal optimizer is operably connected to the control circuits and is capable of receiving the external periodic signal and transforming that signal into a higher frequency signal that maintains its high state for at least the critical set-up time and its low state for at least the critical AC time.

The method for designing the improved RAM module synchronized with an external signal according to the present invention begins with designing a preliminary architecture of an RAM module including a plurality of memory cells and peripheral circuits. A critical set-up time, a critical AC time, and an optimization factor must be determined. The critical set-up time is determined from the worst-case scenario circuit in the set-up phase, namely the operation that requires the most time to execute during the set-up phase. The critical AC time is determined from the worst-case scenario circuit in the AC phase. The optimization factor is a number representing how many times the critical set-up time added to the critical AC time will divide into the period of an external clock cycle. An optimization circuit must be designed that can receive a system clock signal as an input and output an optimized clock signal that has a frequency equal to the optimization factor times the frequency of the system clock signal. Additionally, the optimized clock signal must remain in its active state for at least the critical set-up time and in its inactive state for at least the critical AC time.

DETAILED DESCRIPTION OF THE INVENTION

Figure 1:
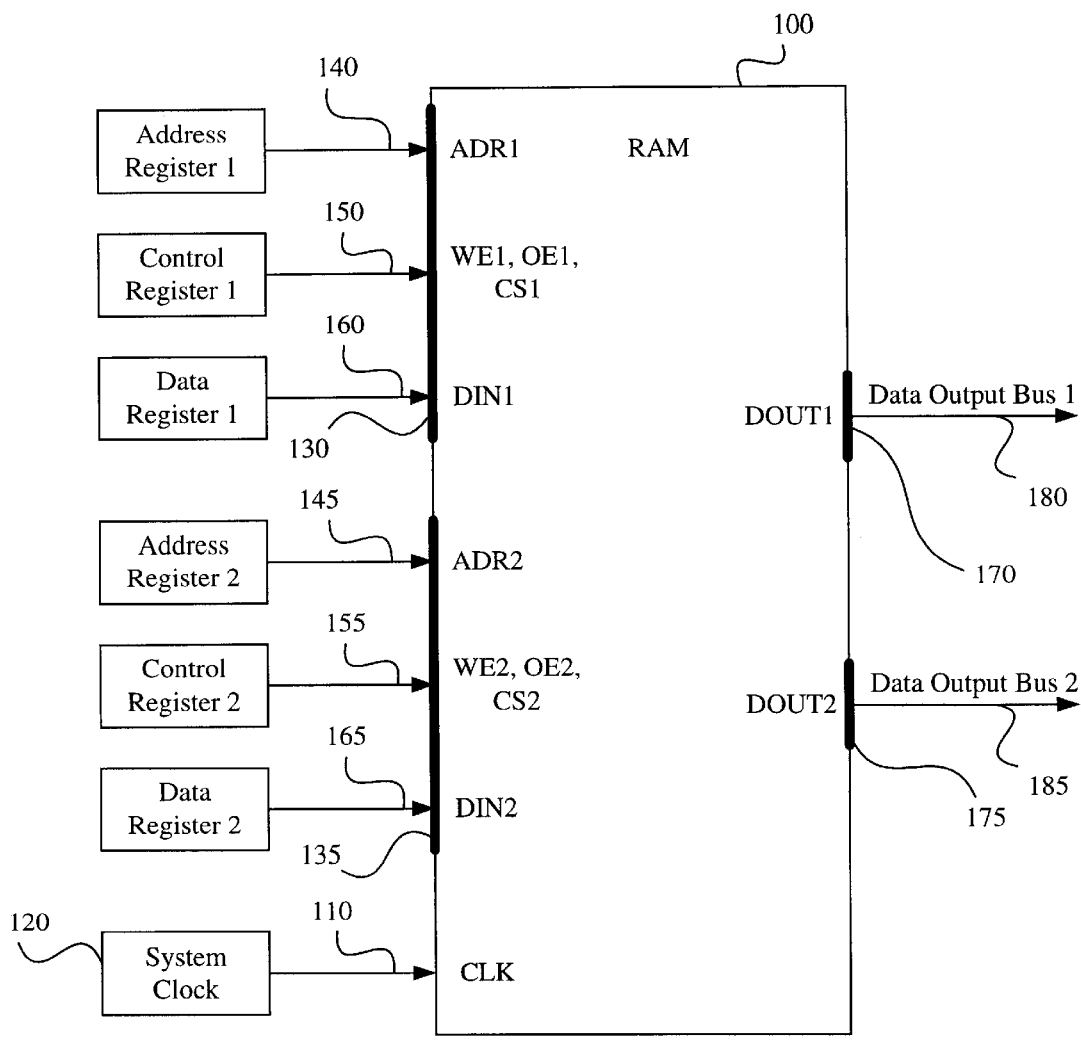
FIG. 1 is a block diagram showing the relationship between a synchronous SRAM integrated circuit and systems with which it interacts.

FIG. 1 shows a typical two port RAM integrated circuit ("module") 100 that is synchronized with a clock signal 110 from an external system clock 120. Each port 130, 135 can receive address signals 140, 145, control signals 150, 155, and input data signals 160, 165. Address signals 140, 145 identify a unique set of memory cells in RAM module 100. Control signals 150, 155 identify which operation is to be performed on the memory cell. Input data signals 160, 165 represents the data to be stored in RAM module 100 during a write operation. Two output ports 170, 175 compliment two input ports 130, 135 so that output data signals 180, 185 can be communicated to other devices.

Figure 2:
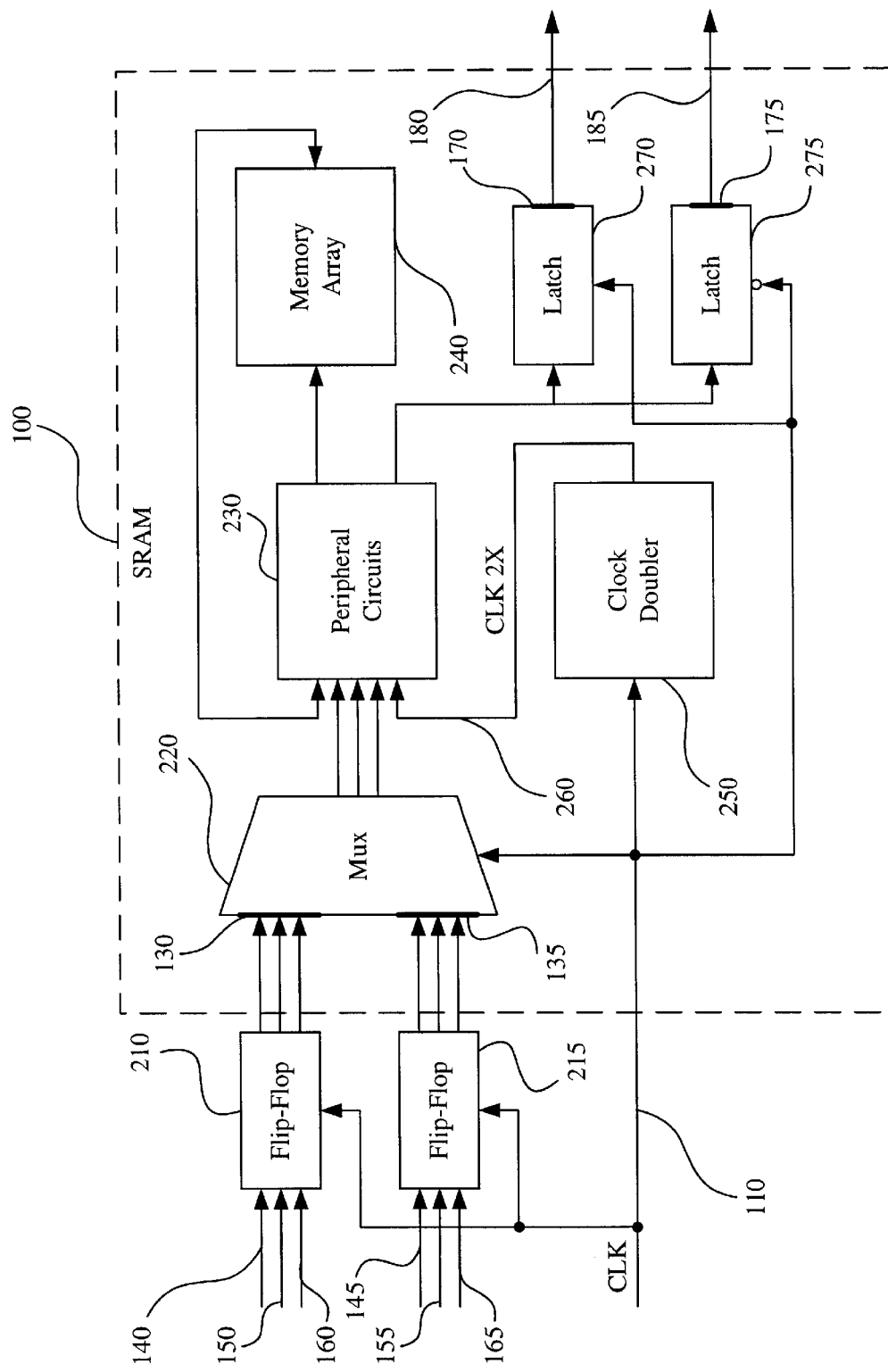
FIG. 2 is a block diagram of an RAM module incorporating the invention.

FIG. 2 shows the basic systems of a preferred embodiment of the invention. Address signals 140, 145, control signals 150, 155 and input data signals 160, 165 are stored in sequential circuits such as sets of flip-flops 210, 215 so that they may be accessed at any time during the external clock cycle. Whether flip-flops 210, 215 are part of RAM module 100 or part of the external system depends upon specific system requirements. A data selector such as a multiplexer 220 chooses which set of signals are passed to peripheral circuits 230 of RAM module 100. Multiplexer 220 allows the signals from one port 130 to pass when external clock signal 110 is high and switches to allow signals from the other port 135 to pass when external clock signal 110 is low. Although the circuits described herein will assume active-high logic, those skilled in the art will be able to apply the concepts to either active-high or active-low circuitry. Similarly, those skilled in the art will be able to replace external clock signal 110 with signal detection circuitry used for asynchronous RAM.

Peripheral circuits 230 communicate with a memory array 240, which is where the data is actually stored. Peripheral circuits 230 decode address signals 140, 145, interpret control signals 150, 155, conduct the pre-charge when necessary, and perform the read and write operations. In order to process the signals from both ports 130, 135 during one full clock cycle, peripheral circuits 230 must be able to complete all the necessary operations of both the set-up phase and the AC phase while external clock signal 110 is in one (either high or low) state.

A clock doubler 250 produces an optimized clock signal 260 that has twice as many transitions from high to low and low to high as the external clock signal 110. Peripheral circuits 230 are constructed so that all the operations of the set-up phase (decoding address signal 140 or 145, interpreting control signals 150 or 155, and conducting the pre-charge) are completed while optimized clock signal 260 is in its high state and all the operations of the AC phase are completed when optimized clock signal 260 is in its low state.

During the AC phase, output data 180, 185 is sent to sequential circuitry such as a pair of latches 270, 275. One latch 270 only receives output data 180 when external clock signal 110 is high, and other latch 275 only receives output data 185 when external clock signal 110 is low. Once received by latches 270, 275, output data signals 180, 185 are accessible to the rest of the system through output ports 170, 175 at any time until the latches 270, 275 are re-latched.

Most synchronous RAM modules can only perform one operation per clock cycle. The set-up phase is performed while a clock signal is in its high state and the AC phase is performed while a clock signal is in its low state. After the RAM module completes the necessary operations for a phase (e.g., address decoding, pre-charging and decision making for the set-up phase) it almost always experiences short periods of inactivity ("dead time") while it waits for the external clock signal to change state so that it may begin the next phase.

Exactly how much dead time each phase experiences is a function of the external clock speed, the specific implementation of the peripheral circuitry and the physical location of the desired memory cell. Since the physical location of the memory cell is a factor, some memory cells may take longer to access than others. If the RAM module did not remain in a phase long enough to accommodate every memory cell, then some memory cells would be inaccessible. Therefore, some of the dead time is necessary.

Figure 3:
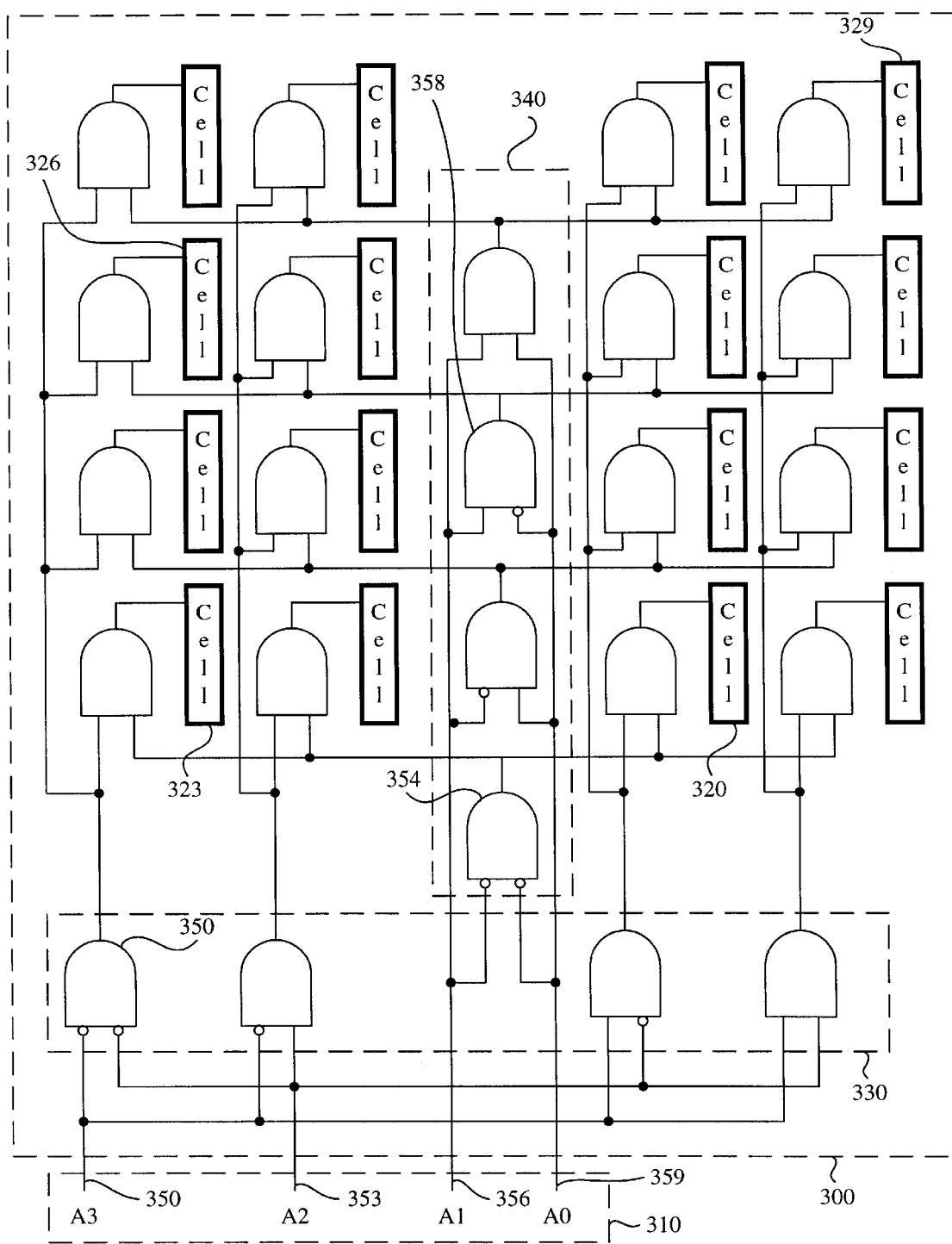
FIG. 3 is a block diagram of one possible implementation of address decoding circuitry.

FIG. 3 shows one possible implementation of address decoding circuitry 300. An address 310 four bits long is able to uniquely identify one memory cell (e.g. 320, 323, 326, 329) out of sixteen. Address decoding circuitry 300 is separated into a column decoder 330 and a row decoder 340. The first two bits 350,353 of address 310 go to column decoder 330, and the second two bits 356, 359 of address 310 go to row decoder 340. The address (0000) activates only memory cell 323 in the bottom left corner. The only active AND gate 350 in column decoder 330 is in the first column and the only active AND gate 354 in row decoder 340 is in the first row. Similarly, the address (0010) activates only memory cell 326 that corresponds to AND gate 350 in the first column and AND gate 358 in the third row. Each unique branch may take a different length of time to activate its associated memory cell. Therefore, when allocating time for address decoding, the worst-case scenario circuitry must be considered.

The worst-case scenario circuit in the set-up phase is the branch that requires the most time to access a particular set of memory cells. For example, if all the operations performed in the set-up phase were performed in series, and a decision to read takes longer than a decision to write, and it takes longest to communicate with memory cell 329 at the address (1111), then the worst-case scenario circuitry would include all the set-up phase operations involved in a read to address (1111). The time required for a signal to propagate through the worst-case scenario circuitry would be the "critical set-up time."

If all the operations performed in the set-up phase were done in parallel, as is more frequently the case, then the worst-case scenario circuitry would only include the operation that takes the longest time to execute. Assuming a read decision takes longer than a write and communicating with the memory cell 329 at address (1111) takes the greatest amount of time, then the durations required for the read decision, decoding the address (1111), and pre-charging would have to be compared to each other. Whichever operation takes the greatest amount of time would be the worst-case scenario for that particular RAM module and would define the critical set-up time.

The AC phase would also have a worst-case scenario circuit that represented a read or write operation to a particular set of memory cells. Once memory cell 320 323, 326, or 329 is active, the appropriate peripheral circuits are able to read or write to that memory cell. Although not shown in FIG. 3, a set of bit lines communicate input data 160, 165 to the active set of memory cells during a write operation and communicate stored data from the latches 270, 275 during a read operation.

Similar to what was described above for the set-up phase, the worst-case scenario circuit would define the "critical AC time." Together the critical AC time and the critical set-up time make up the "critical cycle time." Once the critical cycle time is known, a RAM module can be optimized to perform multiple operations during a clock cycle. For example, if the external clock has a period that is at least three times the critical cycle time, the RAM module would hate an optimization factor of three. By tripling the clock speed, the RAM module would process three times the data it would have processed at the lower clock speed.

Of course, the external system would need a method of communicating three separate addresses, control signals, and input data to the RAM module in one system clock cycle. This could be accomplished with a three port RAM module.

Referring back to FIG. 2, a clock doubler 250 is used to provide the peripheral circuits 230 with an optimized clock signal 260 that is twice the frequency of external clock signal 110. Stated differently, clock doubler 250 would produce optimized clock signal 260 that transitions from low to high twice as often as the external clock signal 110.

Clock doubler 250 would be appropriate for an RAM module 100 whose critical cycle time is less than half the period of external clock signal 110. Known modeling and simulation techniques can be used to find the longest branches in both phases and the necessary critical cycle time.

Figure 4:
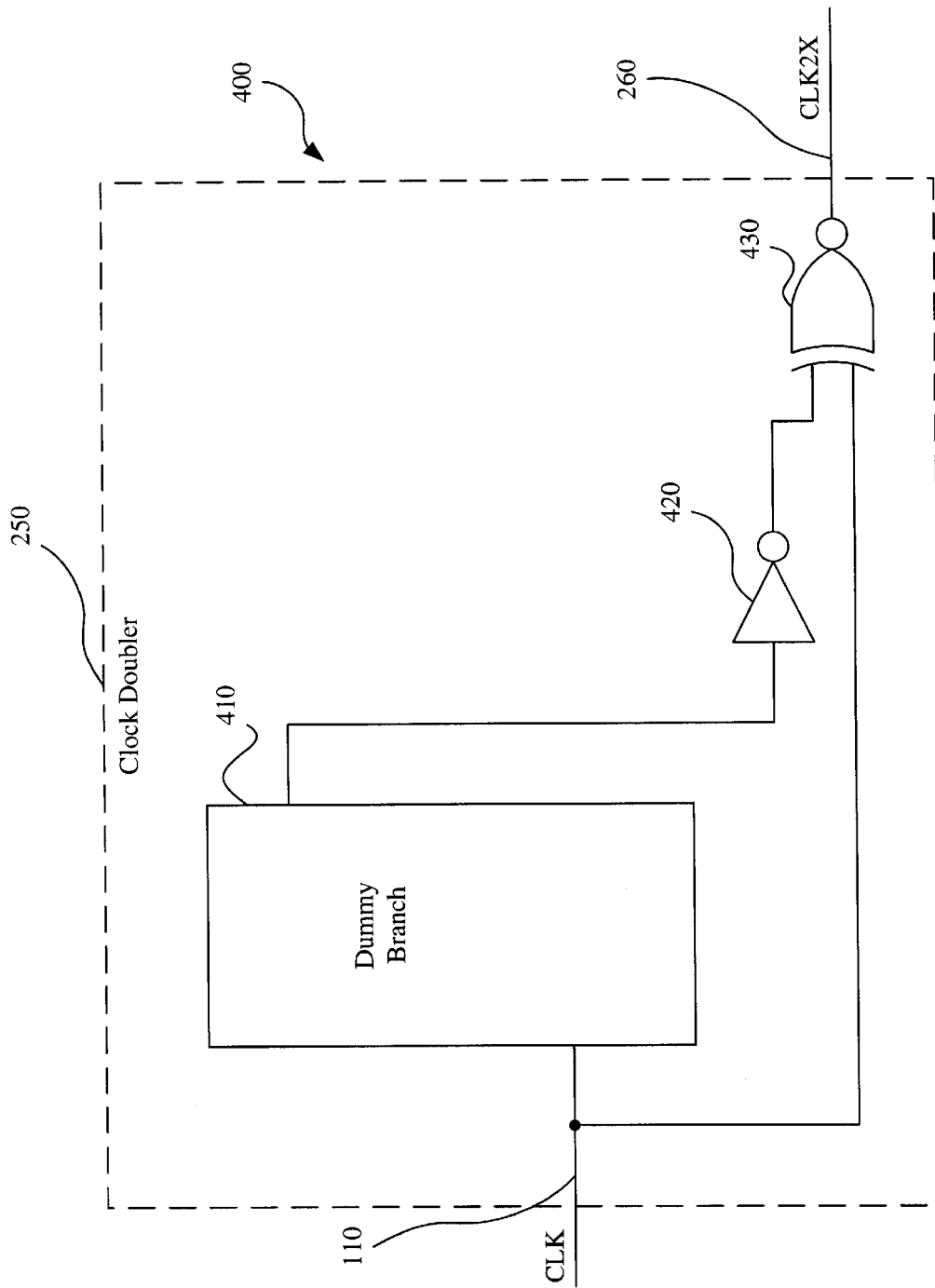
FIG. 4 is a block diagram of a subsystem of the preferred embodiment of the invention.

FIG. 4 shows a logic circuit 400 for constructing clock doubler 250. The branch that generated the worst-case scenario in the set-up phase is duplicated in dummy branch 410. Using this method, constructing a delay of precisely the critical set-up time is greatly simplified. Clock signal 110 is delayed by dummy branch 410 and then inverted by an inverter 420. The output from the inverter is combined with original clock signal 110 in an XNOR gate 430 to produce optimized clock signal 260.

Figure 5A:
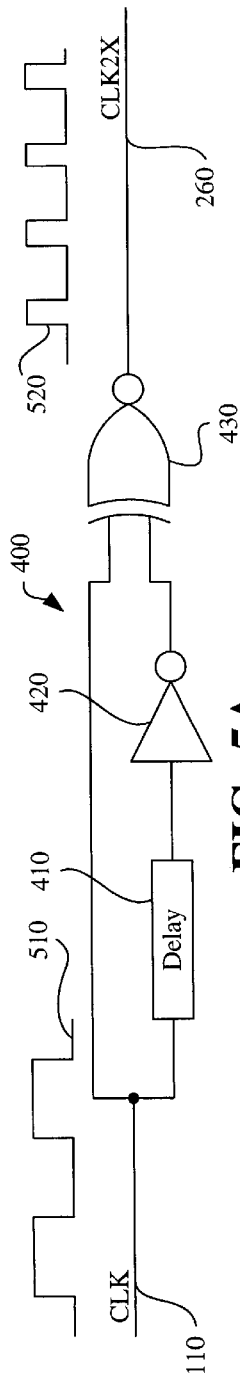
FIGS. 5A–5D are representative logic circuits that produce output signals that have half the period of an input clock signal.

FIG. 5A shows the same logic circuit 400 as is depicted in FIG. 4. Additionally, two cycles of clock signal 110 are shown as a square waveform 510 with a 50% duty cycle. Since XNOR gate 430 produces a high output only when the delayed and inverted signal phase is in the same phase as clock signal 110, a resulting waveform 520 has twice as many transitions as original waveform 510. It should be noted that by using this method the interval for the AC phase would last for at least the critical AC time. Once it is determined that clock doubler 250 is appropriate, fixing the set-up phase to the critical set-up time will necessarily give the AC phase the time it requires. However, if clock signal 110 does not have a 50% duty cycle (i.e., the high and low portion portions of the clock signal 110 are not equal) care must be taken to either ensure that the critical AC time and the critical set-up time can be accomplished in both the high and the low portions of clock signal 110. Alternatively, additional circuitry would be required to either normalize the duty cycle or otherwise ensure that each set-up phase lasted at least as long as the critical set-up time and each AC phase lasted at least as long as the critical AC time.

Figure 5B:
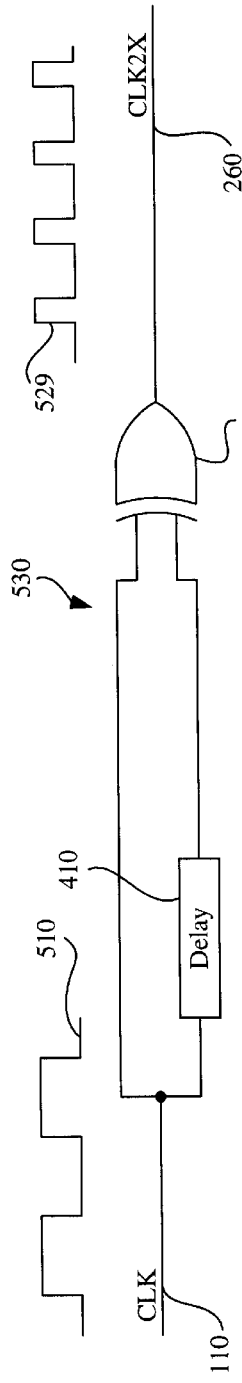
Figure 5C:
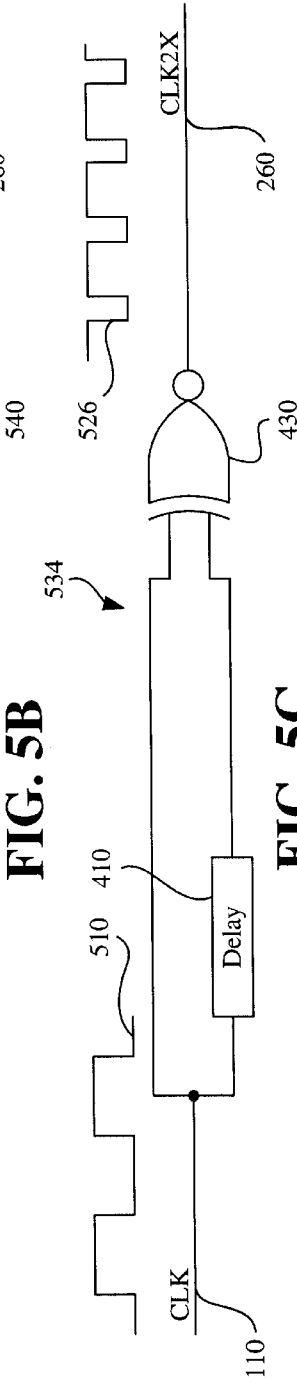
Figure 5D:
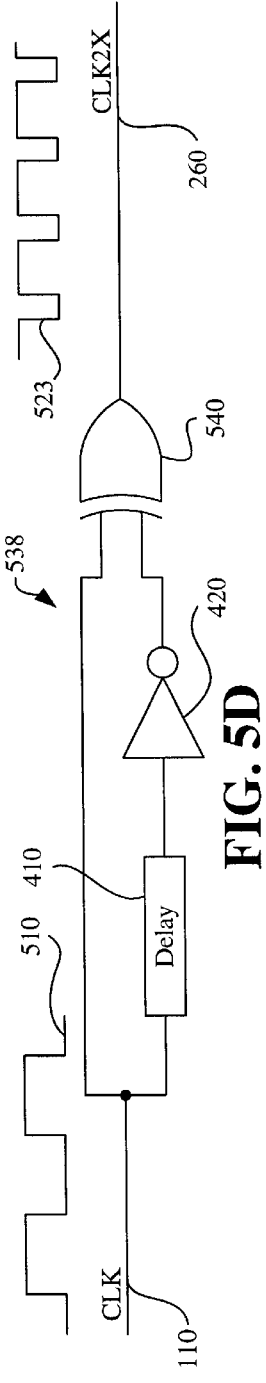

FIGS. 5B–5D show some alternative logic circuits 530, 534, 538 for clock doubler 250. The alternative logic circuit 538 shown in FIG. 5D replaces the XNOR gate 430 in FIG. 5A with an XOR gate 540. Resulting waveform 523 is the compliment of waveform 520 produced by logic circuit 400 shown in FIG. 5A. As shown in FIG. 5C, omitting inverter 420 and using an XNOR gate 430 produces an output waveform 526 that is the same as waveform 523 in FIG. 5D. FIG. 5B indicates that by using an XOR gate 540 and omitting inverter 420, resulting waveform 529 is the same as waveform 520 produced by logic circuit 400 of FIG. 5A. Of course, logic circuits 400, 530 shown in FIGS. 5A and 5B require active-high logic and logic circuits 534, 538 shown in FIGS. 5C and 5D require active-low logic.

Figure 6:
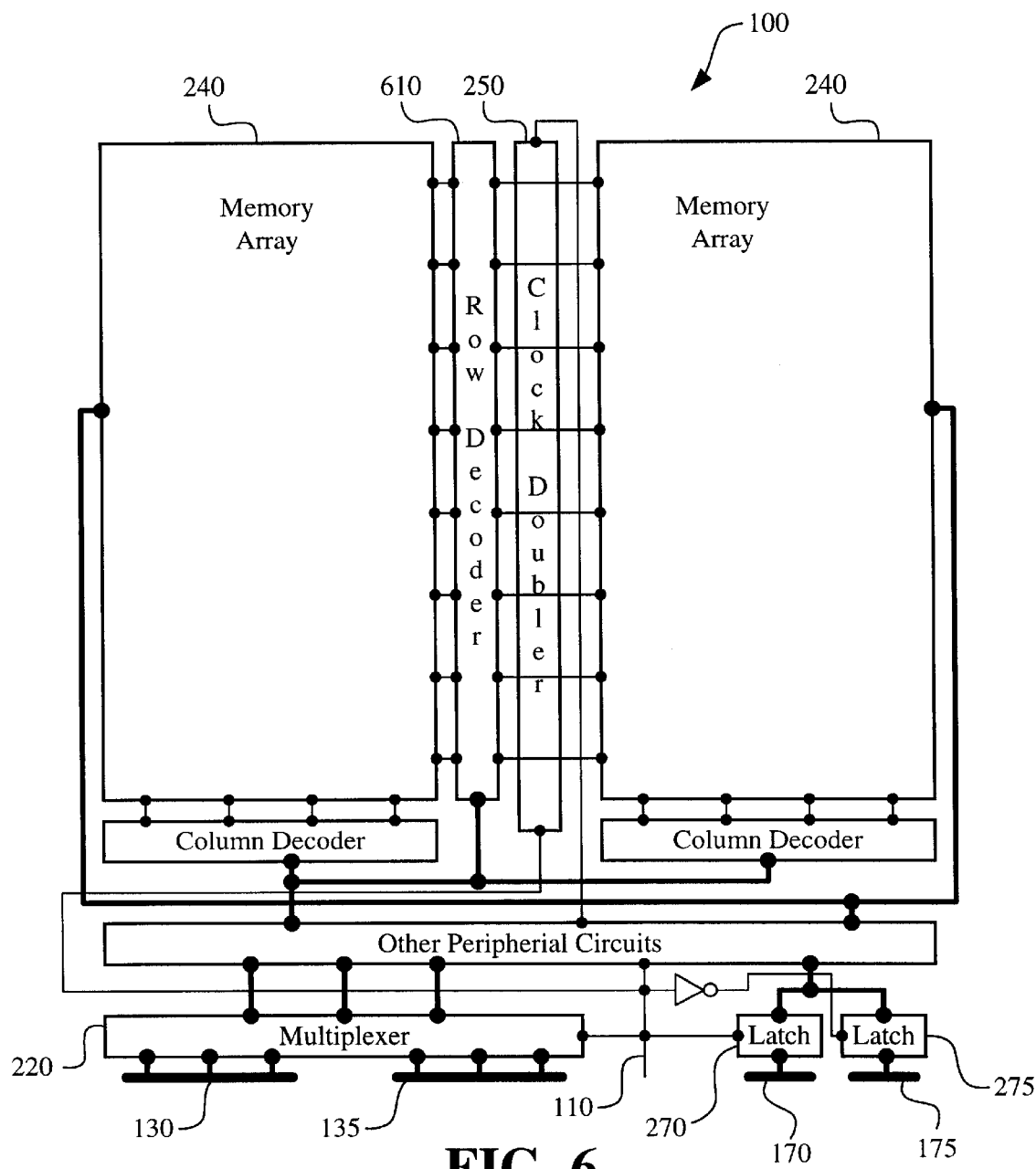
FIG. 6 is a layout of a preferred embodiment of the invention.

The inventors hypothesize that logic circuits shown in FIGS. 5A and 5D may be superior to the others because of the use of inverter 420. If imperfections on the silicon wafer cause dummy branch 410 to not exactly replicate the time it takes for the worst-case scenario, then the extra circuitry involved in inverter 420 may provide enough of an additional delay to compensate for the inadequate dummy branch 410. However, care must be taken because if time is allocated to the set-up phase over the critical set-up time, then time will be taken away from the AC phase, FIG. 6 shows the layout of a preferred embodiment of the invention. In the depicted RAM module 100, modeling and simulation techniques were used to determine that clock doubler 250 is appropriate and that row decoder 610 portion of the address decoder takes the longest interval of time for the worst-case scenario. Clock doubler 250 is positioned physically next to row decoder 610 for a more accurate delay.

Figure 7:
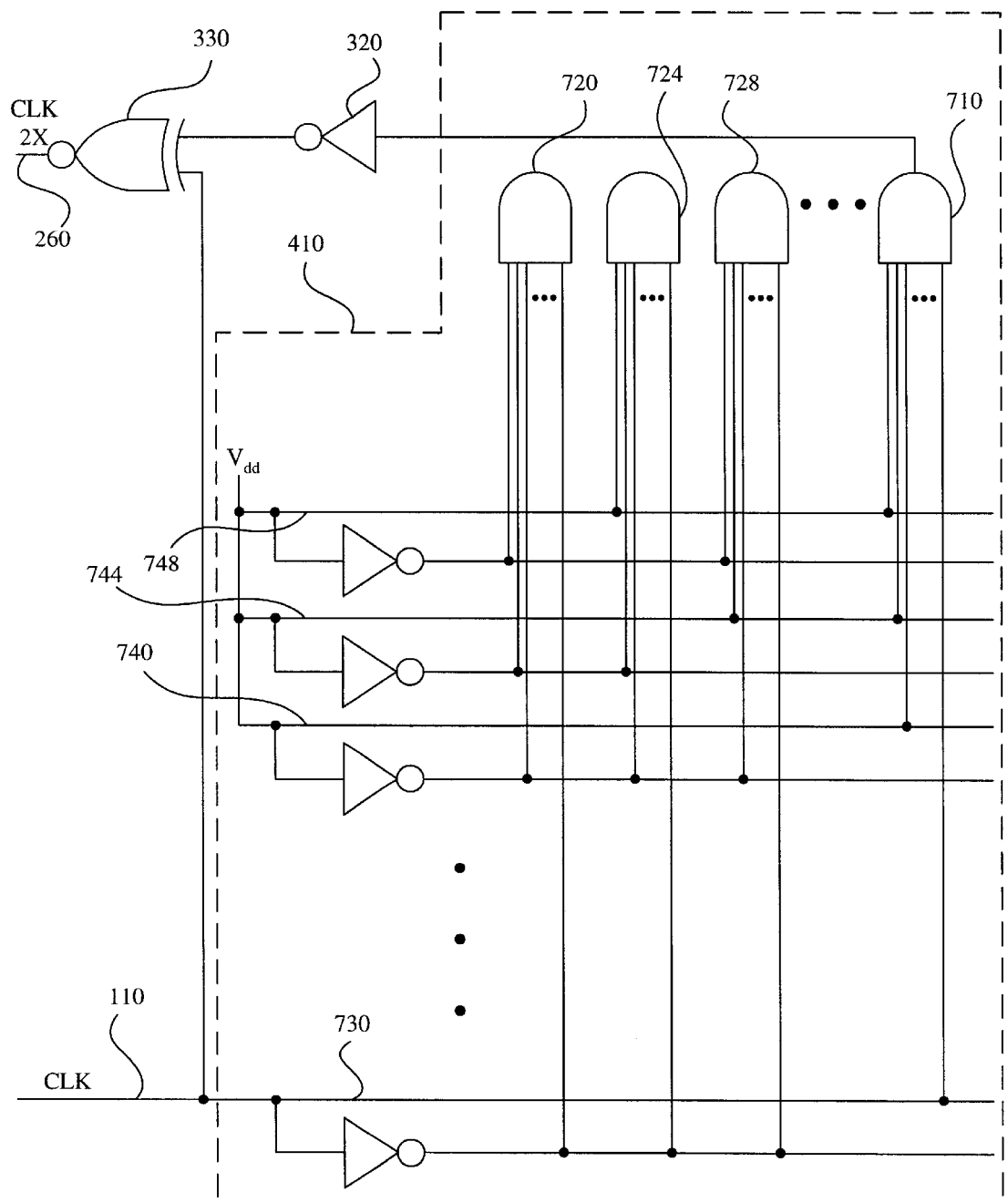
FIG. 7 is a circuit diagram of a subsytem of the preferred embodiment of the invention.

FIG. 7 shows one possible architecture of clock doubler 250. In this case, the specific address of the worst-case scenario for row decoder 610 was determined to be (111 . . . 1). Delay circuit 410 is a dummy branch representing the same circuitry as row decoder 610. Instead of activating a memory cell, the output of AND gate 710 is inverted and used as an input for an XNOR gate 330 to produce an optimized clock signal 260. All other AND gates 720, 724, 728 are non-functional and have no output. While not required, these non-functional AND gate circuits 720, 724, 728 are used to better approximate both the capacitance and the placement of the worst-case scenario circuitry. Only a dummy address line 730 that it is the furthest distance from the active AND gate 710 receives the clock signal 110. The other dummy address lines 740, 744, 748 are permanently tied to the high state.

One possible use of the invention is to dedicate one port to DMA accesses. By allowing all DMAs to use the second port, the processor would not be required to arbitrate DMA requests. Of course, the processor would still need to communicate with a DMA controller for allocation of memory blocks and other similar functions.

Although the invention has been described in its presently contemplated best mode, it is clear that it is susceptible to numerous modifications, modes of operation and embodiments, all within the ability and skill of those familiar with the art and without the exercise of further inventive activity. Accordingly, that which is intended to be protected by Letters Patents is set forth in the claims and includes all variations and modifications that fall within the spirit and scope of the invention.

We claim:

1. A RAM module synchronizable with a signal, comprising:

a memory array having a plurality of memory cells;

peripheral circuits, connected with the memory array, controlling the operation of the RAM module, and including peripheral set-up phase circuits controlling the operation of a set-up phase and having a plurality of set-up branches, each with a destination, the branches including a longest set-up branch that is the set-up branch that takes the longest interval of time to communicate with its destination, the longest set-up branch being characterized by a critical set-up time equal to the time needed for a signal to propagate to the destination of the set-up branch; and a signal transition doubler, connected with the peripheral circuits, receiving the signal, and including:

a delay circuit that receives the signal as an input and outputs a delayed signal that is delayed by at least the critical set-up time; and a logic circuit that receives the signal and the delayed signal as inputs and in response outputs a signal that has twice as many transitions of the signal.

2. The RAM module of claim 1 wherein the delay circuit duplicates the circuitry of the longest set-up branch.

3. The RAM module of claim 2 wherein the delay circuit is physically positioned in close proximity to the longest set-up branch.

4. The RAM module of claim 1 wherein the signal is an external clock signal.

5. The RAM module of claim 4, further comprising:

two ports for receiving input data, control signals and address signals;

a data selector, outputting the input data, control signals and address signals received from one port to the peripheral circuits when the external clock signal is high and outputting the input data, control signals and address signals received from the other port to the peripheral circuits when the external clock signal is low; and a pair of sequential circuits, operably connected with the peripheral circuits, responsive to the external clock signal such that one sequential circuit will only store data when the external clock signal is high and the other sequential circuit will only store data when the external clock signal is low.

6. The RAM module of claim 5 wherein one port is dedicated for direct memory accesses.

7. The RAM module of claim 2 wherein the clock doubler further comprises an inverter circuit operably connected to the delay circuit, the inverter circuit causing the delayed clock signal to be inverted prior to being received by the logic gate.

8. A method for designing an RAM module synchronizable with an external clock signal, comprising:

designing a preliminary architecture of an RAM module having peripheral circuits and a plurality of memory cells;

estimating a critical set-up time which is the interval of time needed for a worst-case set-up scenario operation that requires the most time to execute during the set-up phase;

estimating a critical AC time which is the interval of time needed for a worst-case AC scenario operation that requires the most time to execute during the AC phase;

estimating an optimization factor which is the number of times the critical AC time added to the critical set-up time can go into the period of an external clock cycle;

designing an optimization circuit useful to receive the external clock signal as an input and output an optimized clock signal that transitions from its high state to its low state a number of times equal to the optimization factor times the number of times the external clock transitions from its high state to its low state, the optimized clock signal remaining in its active states for at least the critical set-up time and its inactive state for at least the critical AC time;

designing the final architecture for the RAM module, the final architecture including the plurality of memory cells, the peripheral circuits and the optimization circuit.

9. The method of claim 8 wherein the optimization factor is a whole number.

10. The method of claim 8 wherein the optimization factor is a fractional number number.

11. The method of claim 8 wherein the step of creating an optimization circuit further comprises creating a delay circuit that can delay a signal for at least the critical set-up time.

12. The method of claim 11 wherein the step of creating a delay circuit further comprises duplicating the circuitry of the worst-case set-up phase scenario.

13. The method of claim 12 further comprising the step of using the RAM module in a microprocessor that does not need to pause its own access of the RAM module while a direct memory access is performed.

14. A RAM module synchronized with an external periodic signal, comprising:

a memory array having a plurality of memory cells and a plurality of bit lines operably connected with the plurality of memory cells;

control circuitry, operably connected with the memory array, regulating the operation of the memory cells, and being characterized by a control time equal to the interval of time the control circuitry requires to complete its most time-consuming operation;

an address decoder, operably connected with the memory array, selecting a single memory cell within the memory array, and being characterized by an address time equal to the interval of time the address decoder requires to complete its most time-consuming operation;

pre-charge circuitry, operably connected with the memory array, charging the bit lines of the memory array to a predetermined state, and being characterized by a pre-charge time equal to the interval of time the pre-charge circuitry requires to complete its most time-consuming operation;

read circuitry, operably connected with the bit lines of the memory array, receiving signals from the memory cells within the memory array, and being characterized by a read time equal to the interval of time the read circuitry requires to complete its most time-consuming operation;

write circuitry, operably connected with the bit lines of the memory array, replacing the signals stored by the memory cells within the memory array, being characterized by a write time equal to the interval of time the write circuitry requires to complete its most time-consuming operation; and a signal optimizer, operably connected with the control circuits, address decoder, pre-charge circuitry, read circuitry and write circuitry, receiving the external periodic signal, and transforming the external periodic signal into a signal that transitions from a high state to a low state a greater number of times than the external periodic signal that maintains its active states for at least a critical set-up time and its inactive state for at least a critical AC time, the critical set-up time being equal to either the control time, the address time, or the pre-charge time, whichever is larger, and the critical AC time being equal to either the write time, or the read time, whichever is larger.

15. The RAM module of claim 14 wherein the RAM module is only used for direct memory accesses when the external periodic signal is either low or high.

16. The RAM module of claim 14 wherein the period of the external periodic signal is a whole multiple of the period of the higher frequency signal.

17. The RAM module of claim 14 wherein the signal optimizer further comprises a delay circuit, the delay circuit duplicating circuitry that generated the critical set-up time.

18. The RAM module of claim 17 wherein the circuitry that generates the critical set-up time is the address decoding circuitry.

19. The RAM module of claim 17 wherein the circuitry that generates the critical set-up time is the control circuitry.

* * * * *